United States Patent
Ha et al.

(10) Patent No.: US 6,903,568 B2
(45) Date of Patent: Jun. 7, 2005

(54) CIRCUIT FOR REDUCING LEAKAGE CURRENT IN A PROCESSOR

(75) Inventors: Min-Woong Ha, Yongin-si (KR); June-Hyeok Im, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/776,217

(22) Filed: Feb. 12, 2004

(65) Prior Publication Data

US 2004/0160219 A1 Aug. 19, 2004

(30) Foreign Application Priority Data

Feb. 17, 2003 (KR) .................. 10-2003-0009844

(51) Int. Cl.$^7$ ............................................. G01R 31/26
(52) U.S. Cl. ..................................................... 324/765
(58) Field of Search .............................. 324/158.1, 755, 324/759, 761, 765, 768, 763, 764

(56) References Cited

U.S. PATENT DOCUMENTS 6,556,504 B2 * 4/2003 Kwon et al. ........... 365/230.08
6,697,387 B1 * 2/2004 Larson ....................... 370/546

* cited by examiner

*Primary Examiner*—Michael Tokar
*Assistant Examiner*—Trung Q. Nguyen
(74) *Attorney, Agent, or Firm*—Roylance, Abrams, Berdo & Goodman, L.L.P.

(57) ABSTRACT

A circuit for reducing leakage current in a processor of an electronic apparatus, the processor having a joint test action group (JTAG) test terminal, is disclosed, which includes an initialization test pin included in the JTAG test terminal; a reset pin of the processor; and a semiconductor device connected between the initialization test pin and the reset pin, wherein the initialization test pin, the reset pin, and the semiconductor device are arranged to enable forward current to flow from the initialization test pin to the reset pin through the semiconductor device.

12 Claims, 7 Drawing Sheets

RESETB (IN OPERATION)

FIG.6A

TRSTB (BE AFFECTED)

CIRCUIT FOR REDUCING LEAKAGE CURRENT IN A PROCESSOR

PRIORITY

This application claims priority to an application entitled "Circuit for reducing leakage current in processor" filed in the Korean Intellectual Property Office on Feb. 17, 2003 and assigned Serial No. 2003-9844, the contents of which are incorporated herein by reference.

BACKGROUND OF THE INVENTION

1. Field of the Invention

The present invention relates to a circuit for reducing current consumption in a processor, and more particularly to a circuit for reducing current consumption by decreasing leakage current at a joint test action group (JTAG) test terminal.

2. Description of the Related Art

Processors are devices for controlling electronic apparatuses. Accordingly, they are essentially used in electronic apparatuses. These processors are used in various fields such as home electronics (e.g., computers, cell phones, and televisions as well as various transmission systems (e.g., base stations, base station controllers, and mobile exchange systems for a cell phone service).

Some electronic apparatuses are operated with only one processor. When an electronic apparatus is operated with one processor also known as a System On a Chip (SOC), the processor is provided with terminals for developing packaged programs and peripheral circuits.

Hereinafter, a chip such as an test mode select input (MSM) chip for use in mobile communication terminals, etc., and a chip from the Intel corporation will be described as an example.

The above-mentioned chip has a JTAG terminal for testing. Typically, the JTAG terminal includes five pins. Hereinafter, the pins will be described.

The first is a test clock input (TCK) pin to which a test clock signal is input, the second is a test reset input (hereinafter, referred to as a TRSTB) pin for performing a reset in a test operation, the third is a test data output (TDO) pin from which data are output in a test operation, the fourth is a test data input (TDI) pin to which data are input in a test operation, and the fifth is a TMS pin for placing the JTAG terminal in a test mode operation.

When developing a one chip printed circuit board, the JTAG terminal as described above is used for testing the printed circuit board, detecting a failure state of a chip, or monitoring an upgrade of a program to be tested in a product and the status of a program in operation.

A semiconductor chip supporting the JTAG test includes a tap controller. Further, the TRSTB pin (hereinafter, referred to as an initialization test terminal), which initializes the tap controller of the semiconductor chip supporting the JTAG test, maintains an initialization value using a pull up resistor on the inside of the chip for performing an initialization operation in the JTAG test. The pin is connected to initialize an operation of a processor in the chip in a normal operation mode of a system. Accordingly, referring to JTAG specification (ARM DDI 0029G) which is incorporated herein by reference and is a standard document for the JTAG terminal, after the power of the chip is turned on, the initialization test terminal maintains a low state (0) for an initial predetermined time and then is converted to a high state (1), or the initialization test terminal continuously maintains the low state from the beginning, so that the processor can operate normally.

Further, the initialization test terminal, which initializes the tap controller in the semiconductor chip used in constructing the system supporting the JTAG test, prevents a reset operation due to an exterior noise component from occurring by using the pull up resistor on the inside of the chip, similar to a general reset pin.

Further, the chip receives data and control signals through other pins of the JTAG terminal. For example, the data and control signals input as described above are output as data and control signals, which are converted to signals capable of being processed by the processor, from a JTAG interface circuit. That is, the data and control signals input from a test apparatus are input through each pin of the JTAG terminal, are processed by the JTAG interface circuit on the inside of the chip, and then are processed by the processor.

Meanwhile, since the JTAG terminal is used only when performing a test, or performing an upload or update of a program in the manufacture of a product, the JTAG terminal becomes useless once the product has been placed on the market That is, since the terminal does not perform special functions, the above-mentioned pins are generally mounted on the product in a floating state. Additionally, the initialization test terminal of the pins performs a reset operation and resets the processor. Accordingly, when the initialization test terminal maintains the floating state, noise is input due to variations in temperature, impact, static electricity, etc., and the processor may reset.

Figure 1A:
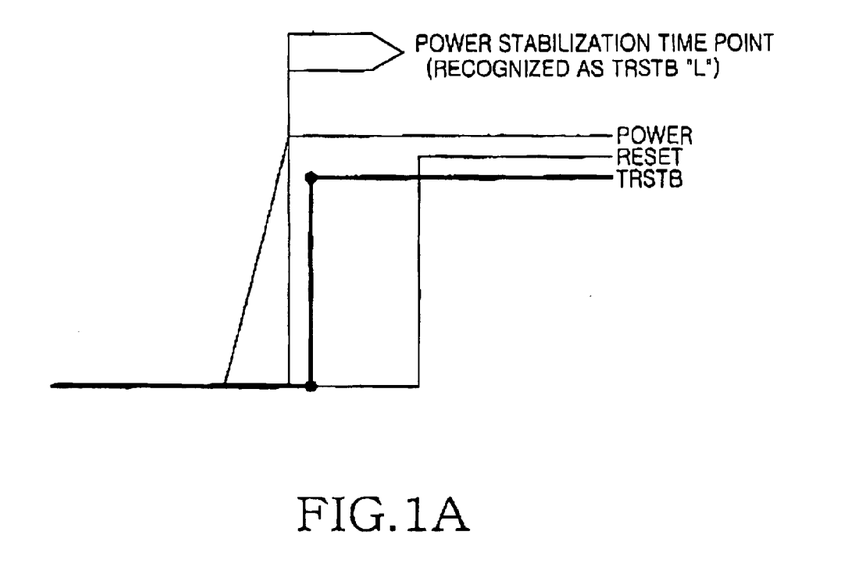
FIG. 1A is a graph illustrating a waveform in a normal state when a TRSTB terminal of a joint test action group (JTAG) according to the prior art is floating.
Figure 1B:
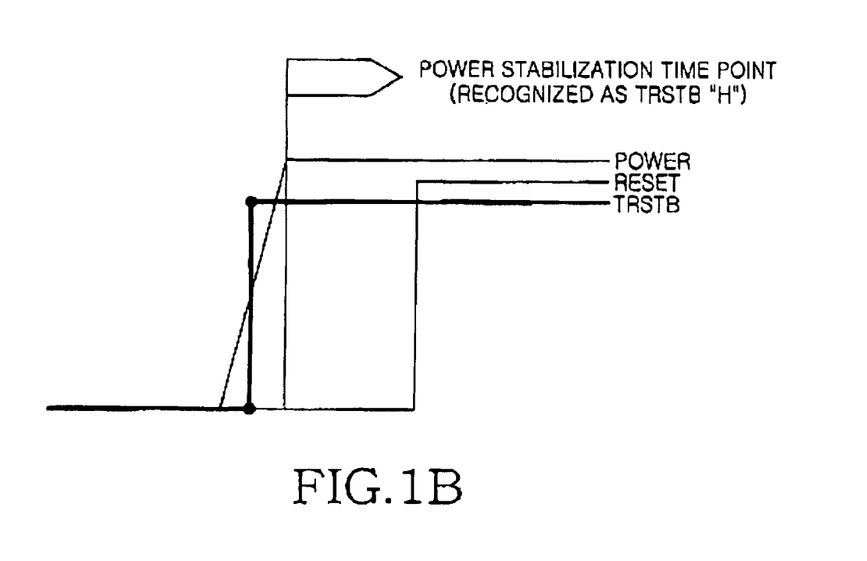
FIG. 1B is a view showing a waveform in an abnormal state when a TRSTB terminal of a JTAG is floating according to the prior art.

Hereinafter, the JTAG terminal will be described in more detail with reference to the graphs shown in FIGS. 1A and 1B. According to the graph shown in FIG. 1A, it is preferred that, a voltage waveform (marked by a thick line) of the initialization test terminal is initially maintained in the low state and then is converted to a high state after the power is turned on and after a power stabilization time point.

However, as described above, when the initialization test terminal is opened in the floating state, an unstable operation of the initialization test terminal may be caused by an offset voltage of an I/O pad due to a data cable (Uart voltage) or temperature variations when power is initially applied to the processor. Therefore, an abnormal operation such as 'no booting' may occur. That is, referring to FIG. 1B, the initialization test terminal (marked by a thick line) is converted to a high state prior to the power stabilization time point, thereby causing an abnormal operation.

Accordingly, in order to prevent the abnormal phenomenon from occurring, the existing circuit has a pull down resistor connected to the JTAG initialization test terminal, which enables the voltage of the initialization test terminal to be always maintained in the low state.

Figure 2:
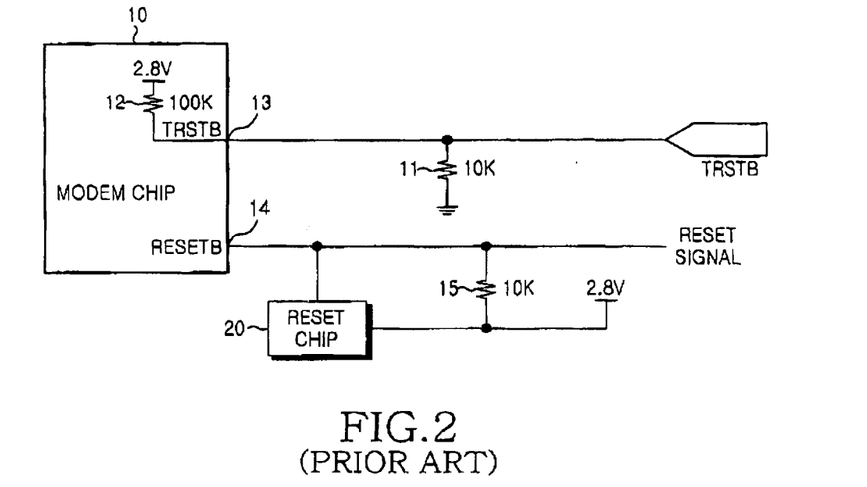
FIG. 2 is a diagram illustrating a resistor connected to a TRSTB terminal of a JTAG according to the prior art.

FIG. 2 is a diagram of a circuit formed when the pull down resistor is connected to the JTAG initialization test terminal according to the prior art.

Figure 3:
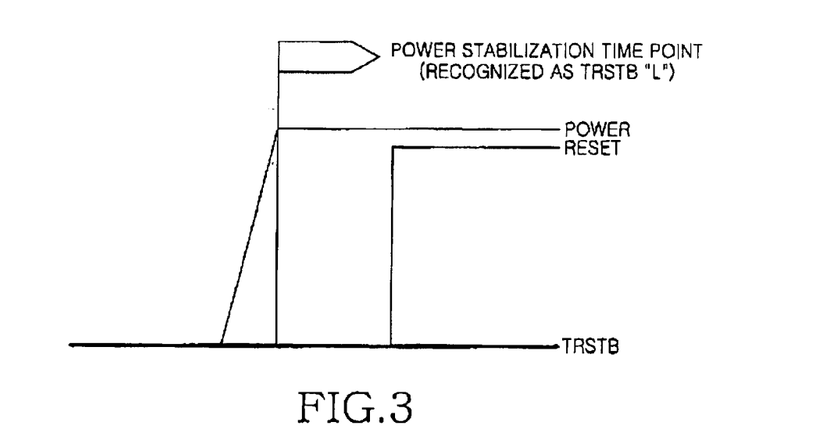
FIG. 3 is a graph illustrating a waveform when a resistor is connected to a TRSTB terminal of a JTAG according to the prior art.

Referring to FIG. 2, the pull down resistor 11 is connected to an exterior of the initialization test terminal 13 of the processor 10. In a normal mode, the pull down resistor 11 enables the voltage of the initialization test terminal 13 to be initially in a low state (0) for a processor initialization in the chip. Further, a pull up resistor 12 is in the processor chip 10 and is connected to the initialization test terminal 13. Accordingly, the initialization test terminal 13 receives a signal from a test apparatus in a JTAG test mode. That is, as shown in FIG. 3, the pull down resistor 11 enables the voltage (marked by a thick line) of the initialization test terminal 13 to remain in the low state (0), so that abnormal operation of the JTAG test terminal can be prevented.

Referring to FIG. 2, a reset chip 20 is connected to a reset terminal 14 of the processor 10, and the reset chip 20 applies a reset signal to the reset terminal 14. Specifically, when the power of the processor 10 is turned on, the reset chip 20 typically outputs the reset signal to the reset terminal 14 after the power is turned on and about 20 ms passes. A resistor 15 connected to the reset chip 20 is a pull up resistor for the reset terminal 14.

The reset chip 20 is always connected to the reset terminal 14 in order to reset the processor 10 as described above, and the initialization test terminal 13 and the reset terminal 14 generally maintain a floating state after a product has been produced.

Meanwhile, when the pull down resistor 11 and the pull up resistor 12 are disposed as described above, the product on which the processor is mounted has a current path formed between the pull up resistor 12 on the inside of the chip and the pull down resistor 11 on the exterior of the chip. That is, the processor always has a constant amount of leakage current through the current path. The leakage current can be obtained by the following equation 1 through a calculation based on FIG. 2, in which values of devices are employed in a modem chip in a general portable terminal as an example.

$$I = \frac{V}{R} = \frac{2.8}{(90\ K \pm 20\ K + 10\ K)} = 23 \sim 35\ \mu A \quad \text{equation 1}$$

Herein, the pull up resistor 12 on the inside of the modem chip processor 10 has a theoretical value of 100K as shown in FIG. 2, but it has a value of 90K±20K in actuality.

That is, referring to equation 1, the modem chip processor 10 in the portable terminal always has unnecessarily consumed current of between 23 µA–35 µA through the initialization test terminal even though the processor is not being operated.

Accordingly, when the processor is operated by a battery, for instance, a mobile communication terminal or a notebook computer, the usage time of the product is shortened due to unnecessary leakage current even though the product is not being operated.

SUMMARY OF THE INVENTION

Accordingly, the present invention has been made to solve the above-mentioned problems occurring in the prior art, and an object of the present invention is to provide a circuit for reducing leakage current in an electronic apparatus including a processor having a joint test action group (JTAG) test terminal.

Another object of the present invention is to provide a circuit which can reduce power consumption in an electronic apparatus including a processor having a JTAG test terminal.

A further object of the present invention is to provide a circuit which can increase usage time of a mobile terminal including a processor having a JTAG test terminal.

In order to accomplish the aforementioned objects, according to one aspect of the present invention, a circuit is provided for reducing leakage current in a processor of an electronic apparatus, the processor includes a JTAG test terminal, the circuit comprising an initialization test pin included in the JTAG test terminal; a reset pin of the processor; and a semiconductor device connected between the initialization test pin and the reset pin, wherein the initialization test pin, the reset pin, and the semiconductor device are arranged to enable forward current to flow from the initialization test pin to the reset pin through the semiconductor device.

In the embodiment of the present invention, a diode is connected between the initialization test pin and the reset pin, so that forward bias is applied in a direction from the initialization test pin to the reset pin, thereby enabling current to flow through the diode from the initialization test pin to the reset pin.

In the embodiment of the present invention, a transistor is connected and disposed between the initialization test pin and the reset pin of the processor, so that forward bias is applied from the initialization test pin to the reset pin, thereby enabling current to flow through the transistor from the initialization test pin to the reset pin.

In the embodiment of the present invention, the transistor is an NPN transistor, a collector terminal of the transistor is connected to the initialization test pin, and an emitter terminal of the transistor is connected to the reset pin.

In the embodiment of the present invention, the transistor is an PNP transistor, an emitter terminal of the transistor is connected to the initialization test pin, and a collector terminal of the transistor is connected to the reset pin.

In the embodiment of the present invention, a control signal, which controls current flowing from the initialization test pin to the reset pin, is input to a base terminal of the transistor.

In the embodiment of the present invention, a Metal-Oxide Semiconductor Field Effect Transistor (MOSFET) is connected and disposed between the initialization test pin and the reset pin of the processor, so that forward bias is applied from the initialization test pin to the reset pin, thereby enabling current to flow through the MOSFET from the initialization test pin to the reset pin.

In the embodiment of the present invention, the MOSFET is an N channel MOSFET, a drain terminal of the MOSFET is connected to the initialization test pin, and a source terminal of the MOSFET is connected to the reset pin.

In the embodiment of the present invention, the MOSFET is an P channel MOSFET, a drain terminal of the MOSFET is connected to the initialization test pin, and a source terminal of the MOSFET is connected to the reset pin.

In the embodiment of the present invention, a control signal, which controls voltage applied from the initialization test pin to the reset pin, is input to a base terminal of the MOSFET.

In the embodiment of the present invention, the processor having the JTAG test terminal is a modem chip included in a mobile communication terminal.

In the embodiment of the present invention, the semiconductor device connected between the initialization test pin and the reset pin of the processor is constructed in the processor chip.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, embodiments according to the present invention will be described with reference to the accompanying drawings. In the following description of the present invention, a detailed description of known functions and configuration incorporated herein will be omitted for conciseness.

In the embodiment of the present invention, a semiconductor device is connected between an initialization test terminal of a joint test action group (JTAG) terminal and a reset terminal in order to reduce leakage current at the JTAG terminal for a predetermined test of a processor.

Figure 4A:
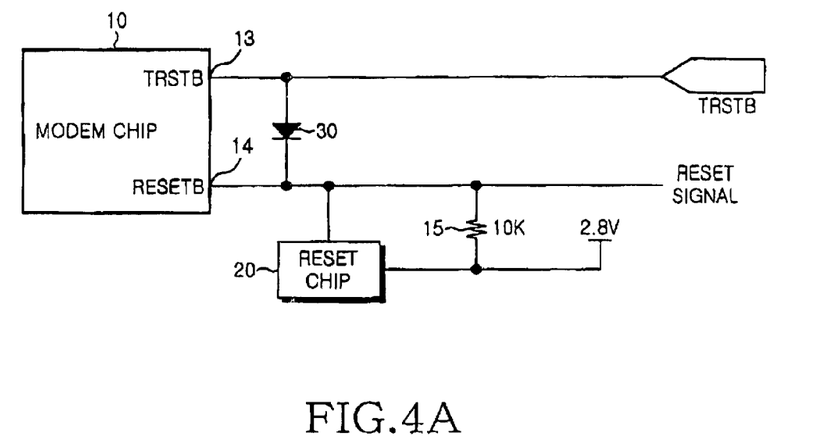
FIG. 4A is a diagram of a circuit illustrating a diode connected to a TRSTB terminal of a JTAG according to a first embodiment of the present invention.

FIG. 4A is a diagram of a circuit illustrating a diode connected to a TRSTB terminal of a JTAG according to a first embodiment of the present invention.

A processor chip 10 includes a JTAG terminal. The JTAG terminal includes five pins comprising a test clock input (TCK) pin, a test reset input (hereinafter, referred to as an initialization test terminal) pin, a test data output (TDO) pin, a test data input (TDI) pin, and a test mode select input (TMS) pin.

FIG. 4A shows only an initialization test terminal (TRSTB) 13 used in a reset relating to embodiment of the present invention. The initialization test terminal 13 is connected to a pull up resistor (not shown) in the chip 10 for an initialization operation in a JTAG test which initializes a tap controller of the processor chip 10 supporting the JTAG test. This results from a certain characteristic of the pin. Specifically, after the power of the chip 10 performing the JTAG test is turned on, the initialization test terminal 13 maintains a low state (0) for an initial predetermined time and then is converted to a high state (1), or the initialization test terminal continuously maintains the low state from the beginning, so that the processor can operate normally. In order to smoothly perform the JTAG test and prevent leakage current from occurring due to a pulldown resistor, a diode 30, which is a kind of semiconductor device, is connected between the initialization test terminal 13 and a reset terminal 14.

Figure 4B:
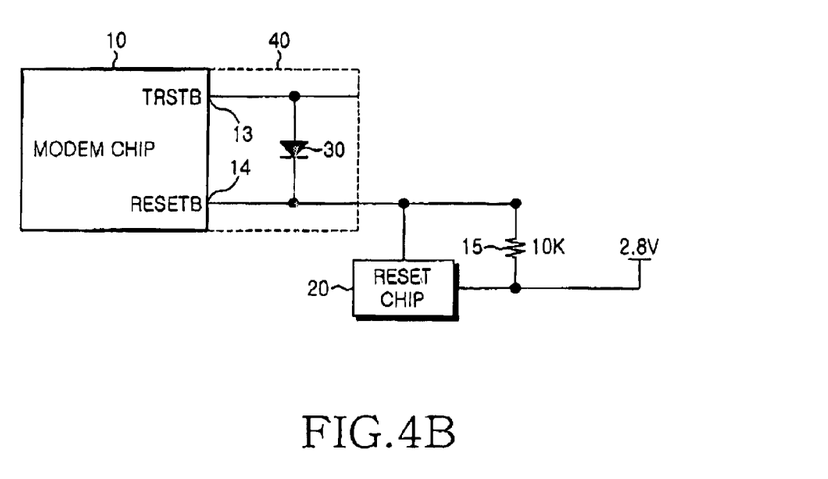
FIG. 4B is a diagram of a circuit illustrating a processor in which a diode is connected to a TRSTB terminal of a JTAG according to a first embodiment of the present invention.

When the diode 30 is connected between the initialization test terminal 13 and the reset terminal 14 as shown in FIG. 4A so that forward bias is applied therebetween, leakage of current, which may occur in the case of employing the conventional pull down resistor, is prevented while the voltage required for the conventional initialization test terminal is also achieved. Meanwhile, the circuit including the diode may be included in the processor as shown in FIG. 4B, in which case it is clear that the same result will be obtained as when the circuit is constructed on an exterior of the processor.

Figure 5:
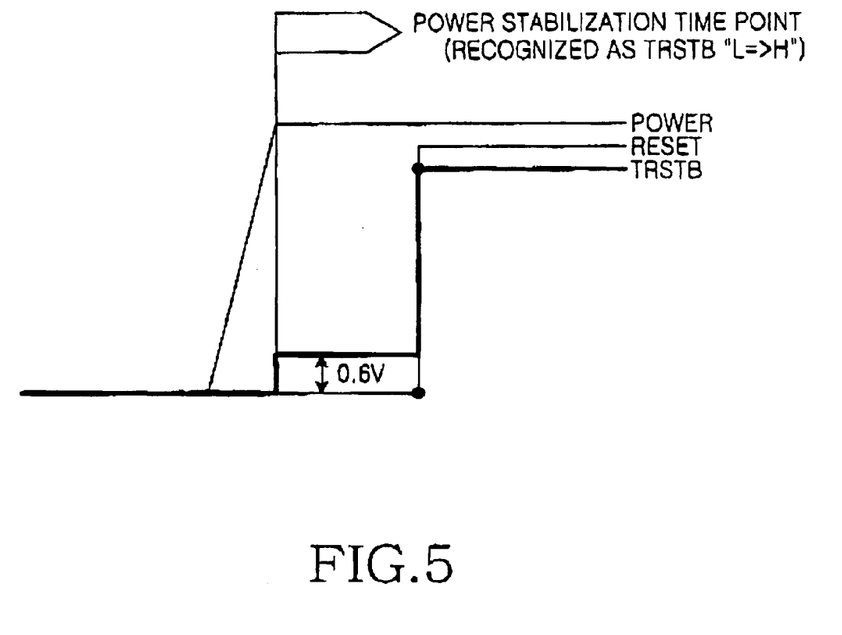
FIG. 5 is a graph illustrating a waveform when a diode is connected to a TRSTB terminal of a JTAG according to an embodiment of the present invention.

Hereinafter, when the diode is provided to the processor 10 and power is applied to the processor, an operation status of the processor 10 will be described referring to FIG. 5.

Firstly, the initialization test terminal 13 maintains a low state until a predetermined time period passes to reach a power stabilization time point after the power is applied to the processor 10. After the power stabilization, it typically takes 20 ms until the reset terminal 14 is converted to a high state for a reset of the processor 10. For the time interval, forward current flows from the initialization test terminal 13 to the reset terminal 14 through the diode 30. Accordingly, a voltage of about 0.6V for the internal voltage of the diode 30 is applied to the voltage of the initialization test terminal 13 as shown in FIG. 5.

Then, when the reset terminal 14 is converted to the high state, a reverse bias is applied to the diode 30, placing the initialization test terminal 13 and the reset terminal 14 are in an open state. Accordingly, the initialization test terminal 13 maintains voltage of 2.8V.

That is, the initialization test terminal 13 is converted to a high state as described above, thereby meeting a condition of an initialization test terminal on a JTAG specification (ARM DDI 0029G). Therefore, an abnormal operation does not occur. Also, reverse voltage is applied from the reset terminal 14 to the diode 30, so that current does not flow. Accordingly, consumption current does not occur.

Specifically, when the power is applied to the processor, forward bias is applied to the diode 30 and only a voltage drop of 0.6V due to the resistance component of the diode 30 itself is applied. That is, a negligible voltage drop occurs through the diode 30 and negligible voltage is applied to the pull up resistor (generally, 100KΩ) in the processor chip 10, so that the initialization test terminal 13 maintains approximately 0V.

Accordingly, in comparison in which a resistor is used, current loss is minimized. Further, after the power is stabilized, when a signal of 2.8V(i.e., a high state) is input to the reset terminal 14 in order to reset the processor, a reverse bias is applied to the diode 30. Therefore, current does not flow through the diode 30. That is, the initialization test terminal 13 and the reset terminal 14 are in an open state.

According to the embodiment of the present invention, the condition of the initialization test terminal is not only met, but also the current loss does not occur.

Further, according to the prior art, since there is no connection between the initialization test terminal 13 and the reset terminal 14, it is unnecessary to consider an effect between the two terminals. However, according to the embodiment of the present invention, since the diode 30 is connected between the initialization test terminal 13 and the reset terminal 14, the effect between the two terminals must be considered. That is, the circuit must be designed so that the reset terminal 14 is prevented from being affected according to the operation of the initialization test terminal 13, because an undesirable reset operation of the processor may occur when the input voltage of the reset terminal 14 is affected according to the input signal of the initialization test terminal 13.

Therefore, there is no influence on the processor even when the two terminals are connected to each other through the diode 30, which will be described hereinafter with reference to FIGS. 6A and 6B.

Figure 6A:
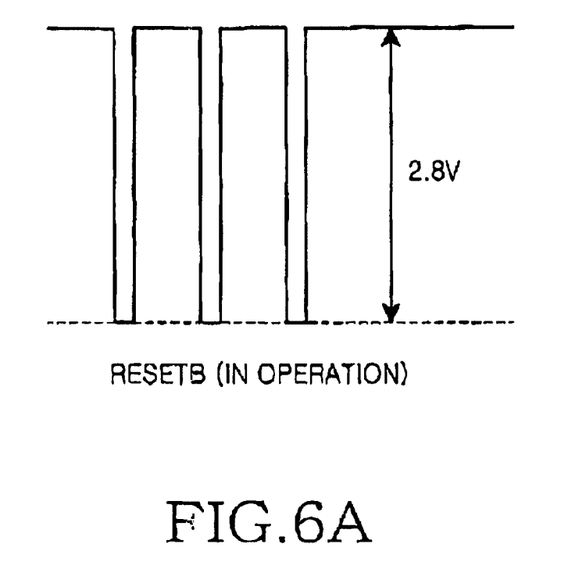
FIGS. 6A through 6D are graphs illustrating voltage influences between an initialization test pin and a reset pin according to an embodiment of the present invention.
Figure 6B:
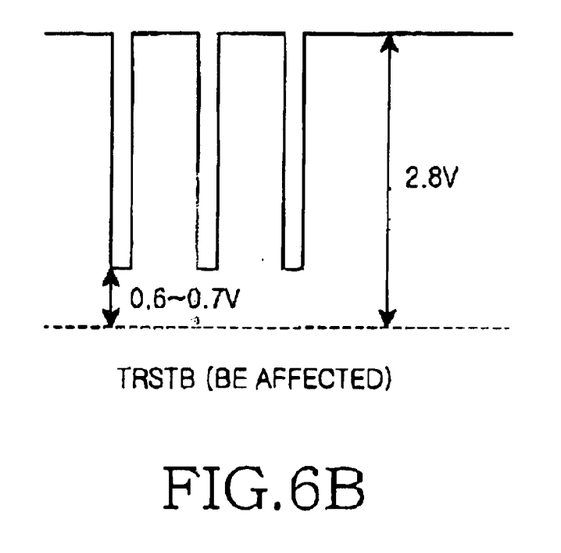

Firstly, FIG. 6A is a graph illustrating the reset terminal 14 in operation, that is, when a clock signal of 2.8V is input to the reset terminal 14, and FIG. 6B is a graph illustrating a voltage variation of the initialization test terminal 13 according to the signal in FIG. 6A. As shown in FIG. 6A, if the voltage of 2.8V is input to the reset terminal 14, when the reset terminal 14 is in a high state according to the clock signal, a reverse bias is applied to the diode 30 between the two terminals, so that current does not flow. Therefore, the initialization test terminal 13 maintains the voltage of 2.8V in a waveform of the initialization test terminal 13 in FIG. 6B. In contrast, when the voltage of the reset terminal 14 falls to a low state, forward bias is applied to the diode 30 between the two terminals, so that forward current flows. Therefore, voltages of 0.6 to 0.7V, that is, voltages according to the resistance component of the diode 30 itself, is applied to the initialization test terminal 13. Accordingly, the initialization test terminal 13 is affected by the signal of the reset terminal 14, so that the function of the reset terminal 14 normally operate.

Figure 6C:
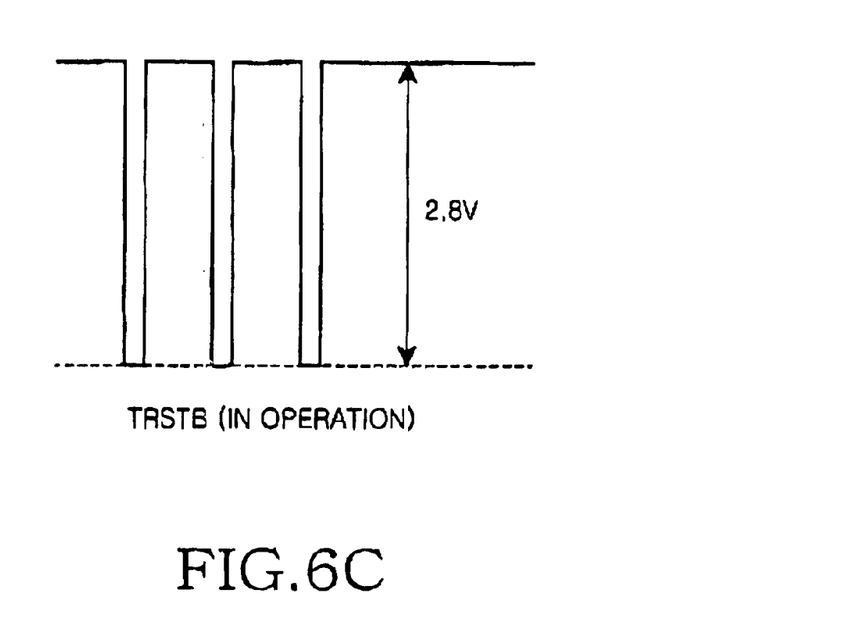
Figure 6D:
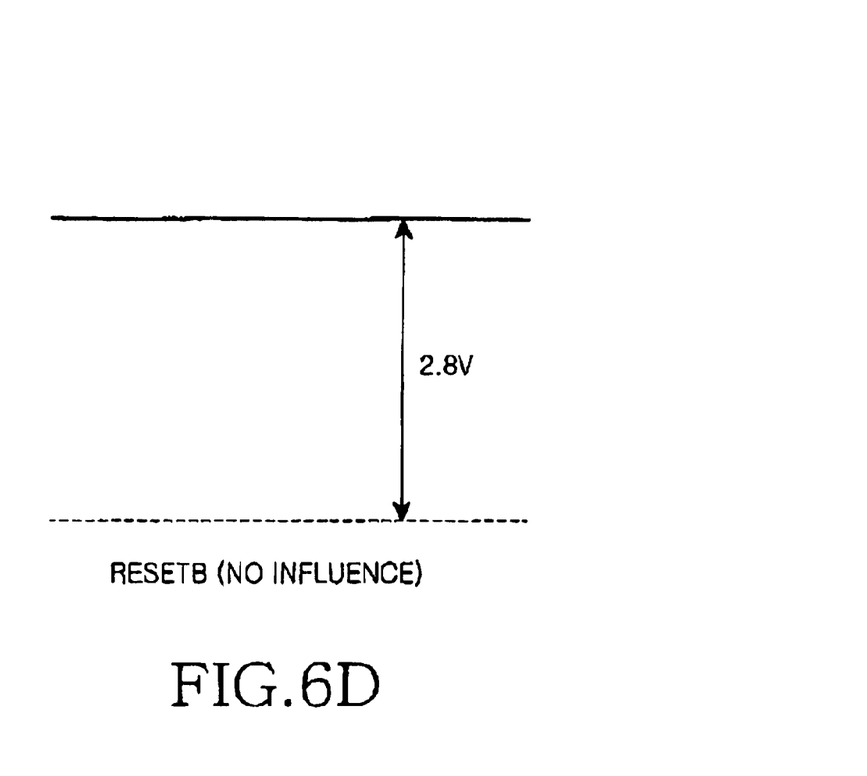

Next, FIGS. 6C and 6D show the response of the reset terminal 14 according to the voltage variation of the initialization test terminal 13.

As shown in FIG. 6C, when the clock signal of 2.8V is input to the initialization test terminal 13, the reset terminal 14 maintains the voltage of 2.8V as shown in FIG. 6D. That is, even though the clock signal of the initialization test terminal 13 falls to a low state, a reverse bias is applied to the diode 30, so that current does not flow through the diode 30. That is, the voltage variation of the initialization test terminal 13 does not have an influence on the reset terminal 14. Accordingly, when various test works are performed through the initialization test terminal 13, an abnormal operation in which the processor 10 is reset by the operation of the reset terminal 14 does not occur.

As a result, even when the diode 30 is connected between the two terminals, the circuit can be realized so that there is no influence between the terminals due to the connection between the two terminals.

Figure 7:
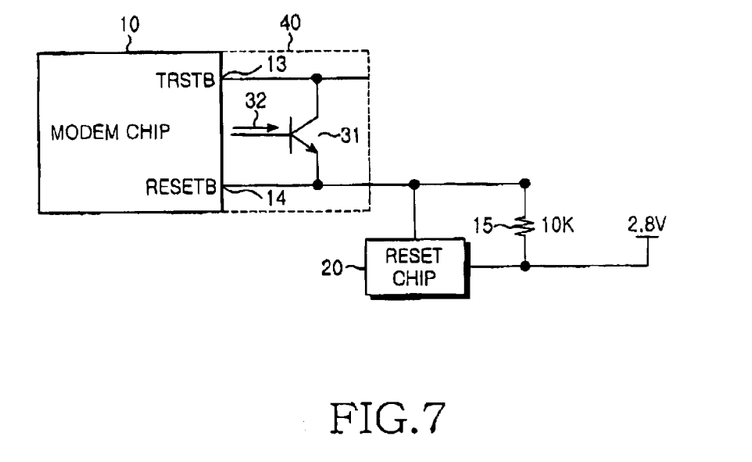
FIG. 7 is a diagram of a circuit illustrating a transistor connected to a TRSTB terminal of a JTAG according to a second embodiment of the present invention.

FIG. 7 is a diagram of a circuit illustrating a transistor connected to an initialization test terminal (TRSTB) of a JTAG according to a second embodiment of the present invention.

Instead of connecting the diode 30 between the initialization test terminal 13 and the reset terminal 14 as described above, the transistor 31 may be connected between the initialization test terminal 13 and the reset terminal 14 as shown in FIG. 7. In this case, the same effect can be obtained as that in the first embodiment. Specifically, when the transistor 31 is an NPN transistor, a collector terminal of the transistor 31 is connected to the initialization test terminal 13 and an emitter terminal of the transistor 31 is connected to the reset terminal 14. Through the connection as described above, the same effect can be obtained as that in the connection through the diode as described above.

Further, a predetermined control signal 32 is applied to a base terminal of the transistor 31, so that the flow of current through the transistor 31 can be easily controlled.

In contrast, when a PNP transistor is used as the transistor 31 (not shown in FIG. 7), an emitter terminal of the PNP transistor is connected to the initialization test terminal 13 and a collector terminal of the PNP transistor is connected to the reset terminal 14.

Figure 8:
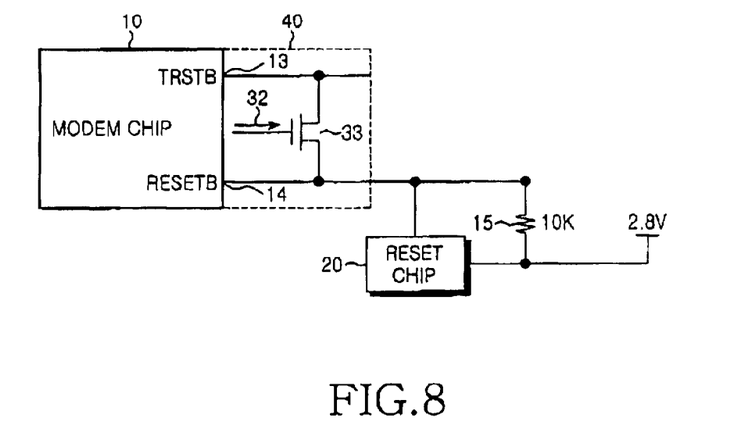
FIG. 8 is a diagram of a circuit illustrating a Metal-Oxide Semiconductor Field Effect Transistor (MOSFET) connected to a TRSTB terminal of a JTAG according to a third embodiment of the present invention.

FIG. 8 is a diagram of a circuit illustrating a metal oxide semiconductor field effect transistor connected to an initialization test terminal (TRSTB) of a JTAG according to a second embodiment of the present invention.

Similar to the construction in FIG. 7, the metal oxide semiconductor field effect transistor (hereinafter, referred to as an MOSFET) 33 may be connected between the initialization test terminal 13 and the reset terminal 14, instead of the diode or the transistor.

Accordingly, a drain terminal of the MOSFET 33 is connected to the initialization test terminal 13 and a source terminal of the MOSFET 33 is connected to the reset terminal 14. Through the connection as described above, the same effect as that in the connection through the diode or the transistor as described above can be obtained. Further, a predetermined control signal 32 is applied to a gate terminal of the MOSFET 33, so that voltage through the MOSFET 33 can be easily controlled.

Also, even when any one of an N channel MOSFET and a P channel MOSFET is used as the MOSFET 33, the object of the present invention can be obtained.

As described above, when an electronic apparatus is manufactured by means of a processor having a JTAG test terminal, a circuit construction of a test pin is performed as described above, so that leakage current can be reduced. Further, when the electronic instrument is constructed to be portable, the usage time can be increased.

While the invention has been shown and described with reference to certain embodiments thereof, it will be understood by those skilled in the art that various changes in form and details may be made therein without departing from the spirit and scope of the invention as defined by the appended claims.

What is claimed is:

1. A circuit for reducing leakage current in a processor of an electronic apparatus, the processor having a joint test action group (JTAG) test terminal, the circuit comprising:
    an initialization test pin included in the JTAG test terminal;
    a reset pin of the processor; and
    a semiconductor device connected between the initialization test pin and the reset pin, wherein
    the initialization test pin, the reset pin, and the semiconductor device are arranged to enable forward current to flow from the initialization test pin to the reset pin through the semiconductor device.

2. The circuit as claimed in claim 1, wherein a diode is connected between the initialization test pin and the reset pin, so that forward bias is applied from the initialization test pin to the reset pin, thereby enabling current to flow through the diode from the initialization test pin to the reset pin.

3. The circuit as claimed in claim 1, wherein a transistor is connected and disposed between the initialization test pin and the reset pin of the processor, so that forward bias is applied from the initialization test pin to the reset pin, thereby enabling current to flow through the transistor from the initialization test pin to the reset pin.

4. The circuit as claimed in claim 3, wherein the transistor is a NPN transistor, a collector terminal of the transistor is connected to the initialization test pin, and an emitter terminal of the transistor is connected to the reset pin.

5. The circuit as claimed in claim 3, wherein the transistor is a PNP transistor, an emitter terminal of the transistor is connected to the initialization test pin, and a collector terminal of the transistor is connected to the reset pin.

6. The circuit as claimed in claim 3, wherein a control signal, which controls current flowing from the initialization test pin to the reset pin, is input to a base terminal of the transistor.

7. The circuit as claimed in claim 1, wherein a Metal-Oxide Semiconductor Field Effect Transistor (MOSFET) is connected and disposed between the initialization test pin and the reset pin of the processor, so that forward bias is applied from the initialization test pin to the reset pin, thereby enabling current to flow through the MOSFET from the initialization test pin to the reset pin.

8. The circuit as claimed in claim 7, wherein the MOSFET is an N channel MOSFET, a drain terminal of the MOSFET is connected to the initialization test pin, and a source terminal of the MOSFET is connected to the reset pin.

9. The circuit as claimed in claim 7, wherein the MOSFET is an P channel MOSFET, a drain terminal of the MOSFET is connected to the initialization test pin, and a source terminal of the MOSFET is connected to the reset pin.

10. The circuit as claimed in claim 7, wherein a control signal, which controls voltage applied from the initialization test pin to the reset pin, is input to a base terminal of the MOSFET.

11. The circuit as claimed in claim 1, wherein the processor having the JTAG test terminal is a modem chip contained in a mobile communication terminal.

12. The circuit as claimed in claim 1, wherein the semiconductor device connected between the initialization test pin and the reset pin of the processor is constructed in the processor chip.

* * * * *